(12) United States Patent
Farooq et al.

(10) Patent No.: US 6,271,111 B1
(45) Date of Patent: *Aug. 7, 2001

(54) HIGH DENSITY PLUGGABLE CONNECTOR ARRAY AND PROCESS THEREOF

(75) Inventors: Shaji Farooq; Suryanarayana Kaja, both of Hopewell Junction; Li Wang, Poughkeepsie, all of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/030,567

(22) Filed: Feb. 25, 1998

(51) Int. Cl.[7] .................................................. H01L 21/44
(52) U.S. Cl. ........................... 438/614; 438/597; 438/615
(58) Field of Search .................................... 438/597, 573, 438/605, 612, 613, 614, 615; 257/736, 737, 738, 780, 781

(56) References Cited

U.S. PATENT DOCUMENTS

| 3,657,610 | 4/1972 | Yamamoto et al. | 257/778 |
|---|---|---|---|
| 3,778,530 | 12/1973 | Reimann | 174/261 |
| 4,463,059 | * 7/1984 | Bhattacharya et al. | 428/620 |
| 4,693,770 | 9/1987 | Hatada | 156/151 |
| 4,807,021 | * 2/1989 | Okumura | 357/75 |
| 5,134,460 | 7/1992 | Brady et al. | 257/737 |
| 5,175,609 | 12/1992 | DiGiacomo et al. | 257/766 |
| 5,367,195 | 11/1994 | DiGiacomo et al. | 257/767 |
| 5,400,220 | 3/1995 | Swamy | 361/760 |
| 5,420,073 | 5/1995 | DiGiacomo et al. | 427/96 |
| 5,442,239 | 8/1995 | DiGiacomo et al. | 257/766 |
| 5,468,995 | * 11/1995 | Higgins, III | 257/697 |
| 5,534,371 | 7/1996 | Patel et al. | 430/5 |
| 5,670,418 | 9/1997 | Ghosal | 438/613 |
| 5,838,069 | * 11/1998 | Itai et al. | 257/766 |
| 5,950,073 | * 9/1999 | Griffin, IV et al. | 438/119 |
| 5,977,783 | * 11/1999 | Takayama et al. | 324/754 |

* cited by examiner

Primary Examiner—Carl Whitehead, Jr.
Assistant Examiner—Jeff Vockrodt
(74) Attorney, Agent, or Firm—Aziz M. Ahsan; Joseph P. Abate

(57) ABSTRACT

The present invention relates generally to high density pluggable connector array and process thereof. More particularly, the invention encompasses a structure comprising high density pluggable connector arrays. A process for making such types of high density pluggable connector arrays is also disclosed.

8 Claims, 2 Drawing Sheets

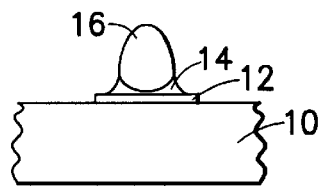
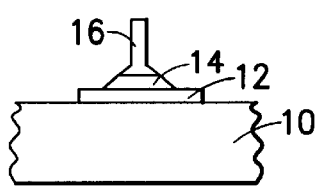
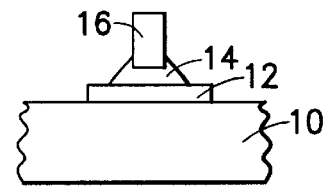
FIG. 1A     FIG. 1B     FIG. 1C
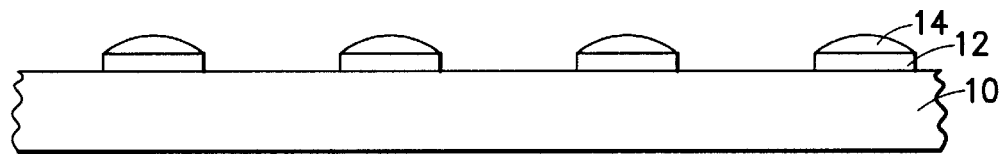
FIG. 2
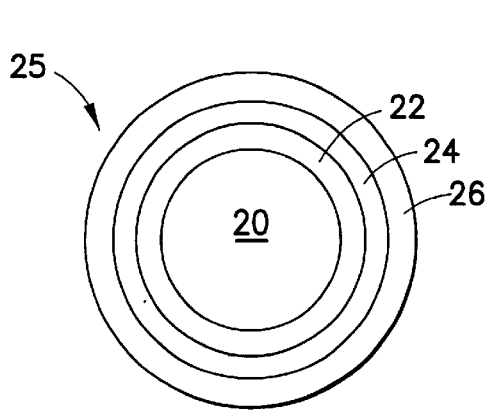
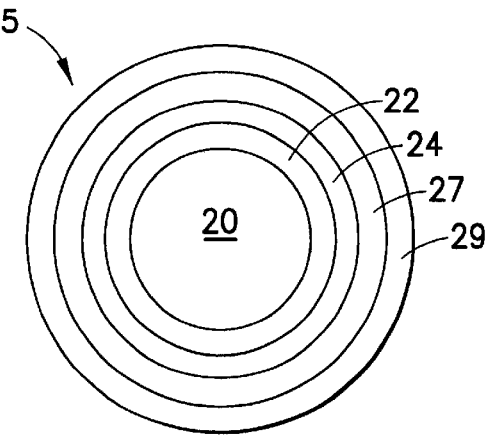
FIG. 3A     FIG. 3B
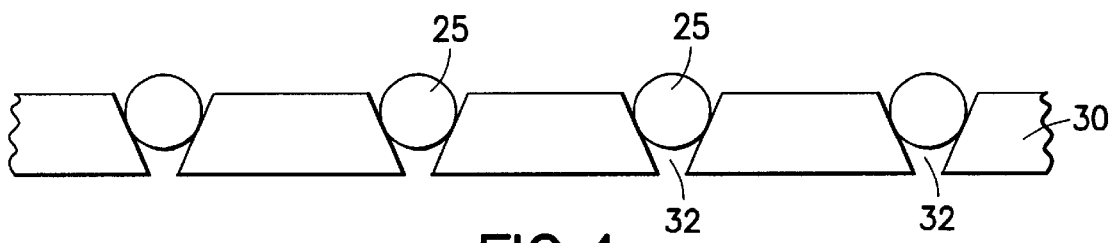
FIG. 4

HIGH DENSITY PLUGGABLE CONNECTOR ARRAY AND PROCESS THEREOF

CROSS-REFERENCE TO RELATED PATENT APPLICATION

This Patent Application is related to U.S. patent application Ser. No. 08/767,918, entitled "METHOD OF JOINING AN ELECTRICAL CONTACT ELEMENT TO A SUBSTRATE", filed on Dec. 17, 1996, and which issued as U.S. Pat. No. 5,670,418, on Sep. 23, 1997, which is presently assigned to the assignee of the instant Patent Application, and the disclosure of which is incorporated herein by reference.

FIELD OF THE INVENTION

The present invention relates generally to a high density pluggable connector array and process thereof. More particularly, the invention encompasses a structure comprising high density pluggable connector arrays. A process for making such types of high density pluggable connector arrays is also disclosed.

BACKGROUND OF THE INVENTION

Semiconductor devices are becoming smaller and more dense with the evolution of new technology. In order to remain competitive chip manufacturers are therefore constantly challenged to improve their products. Significant improvements, such as, reducing process variability, have being made. However, process improvements alone are not sufficient. The inventors have therefore invented a new high density pluggable connector array and a process, and are thus making a contribution to this growing and challenging field.

The prior art has also tried to contribute to this emerging field, for example, U.S. Pat. No. 4,693,770 (Hatada), discloses a method of bonding semiconductor devices together. A metal bump is formed on a substrate, which is transferred and joined onto the electrode of a first semiconductor device, and this first semiconductor device is joined to a second semiconductor device by pressing and heating such that the electrode of the second device and the transferred metal bump are in electrical and physical contact.

U.S. Pat. No. 5,134,460 (Brady), discloses an aluminum bump, a reworkable bump, and titanium nitride structure for tab bonding. On a semiconductor substrate, having a passivation layer, a bump is over an adhesion layer. The bump, made from aluminum, has a coating of a first metallic layer, such as, for example, Ti or Cr, a second metallic layer, such as, for example, Co or Ni, and a metallic layer, such as, for example, Au. The substrate with the bump is subsequently joined to a copper body.

However, the inventors of this invention have discovered a new way of providing a high density pluggable connector array, with the benefit of providing an exposed electrical connection that is resilient to the environment and that has a strong electrical bond to the ceramic or organic substrate.

PURPOSES AND SUMMARY OF THE INVENTION

The invention is a novel method and structure for high density pluggable connector array.

Therefore, one purpose of this invention is to provide an apparatus and a method that will provide a high density pluggable connector array.

Another purpose of this invention is to provide for an electrical interconnection on a ceramic or organic substrate that has a very strong bond and is very economical to manufacture.

Still another purpose of this invention is to have a connector array with a multi-level of metal protection to the electrical interconnect.

Yet another purpose of this invention is to allow the use of low melting solders to join the connecting features, while providing highly reliable gold surface for making electrical contact.

Therefore, in one aspect this invention comprises a high density connector array comprising a substrate having at least one reflowed solder connection connecting an interconnect element to a pad on said substrate, wherein said interconnect element has at least one layer of gold completely enveloping at least one layer of nickel and wherein said layer of nickel completely envelopes a core, and thereby provides said high density connector array.

In another aspect this invention comprises a multi-layered, interconnect structure comprising at least one layer of copper completely enveloping at least one layer of gold, wherein said layer of gold completely envelopes at least one layer of nickel, and wherein said layer of nickel completely envelopes a core, and thereby providing said multi-layered interconnect structure.

In yet another aspect this invention comprises a multi-layered interconnect structure comprising at least one layer of copper completely enveloping at least one layer of cobalt, wherein said layer of cobalt completely envelopes at least one layer of gold, wherein said layer of gold completely envelopes at least one layer of nickel, and wherein said layer of nickel completely envelopes a core, and thereby providing said multi-layered interconnect structure.

In still another aspect this invention comprises a process for forming a multi-layered interconnect structure comprising the steps of:
(a) depositing at least one layer of nickel on a core and completely enveloping said core,
(b) depositing at least one layer of gold over said layer of nickel and completely enveloping said layer of nickel,
(c) depositing at least one layer of copper over said layer of gold and completely enveloping said layer of gold, and thereby providing said multi-layered interconnect structure.

In still yet another aspect this invention comprises a process of making high density connector array comprising the steps of:
(a) placing at least one multi-layered interconnect structure on a boat having at least one means to accommodate at least a portion of said interconnect structure,
(b) forming a sub-assembly by placing said multi-layered interconnect in said boat in intimate contact with a solder connection on a semiconductor substrate,
(c) subjecting said solder connection to reflow conditions such that said solder reflows and joins said multi-layered interconnect structure, and thereby forms said high density connector array.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings and they appear in a random order within the specification. The invention itself, however, both as to organization and method of operation, may best be understood by reference to the detailed description which follows taken in conjunction with the accompanying drawings in which:

FIGS. 1A, 1B and 1C, illustrate a select few interconnection structures.

FIG. 2, illustrates another interconnection structure where the solder bump has been either pressed or reflowed.

FIGS. 3A and 3B, illustrate the preferred embodiments of this invention.

FIG. 4, is an enlarged view of a carrier/boat containing the preferred interconnection elements of this invention to be joined to the substrate.

DETAILED DESCRIPTION OF THE INVENTION

Figure 5:
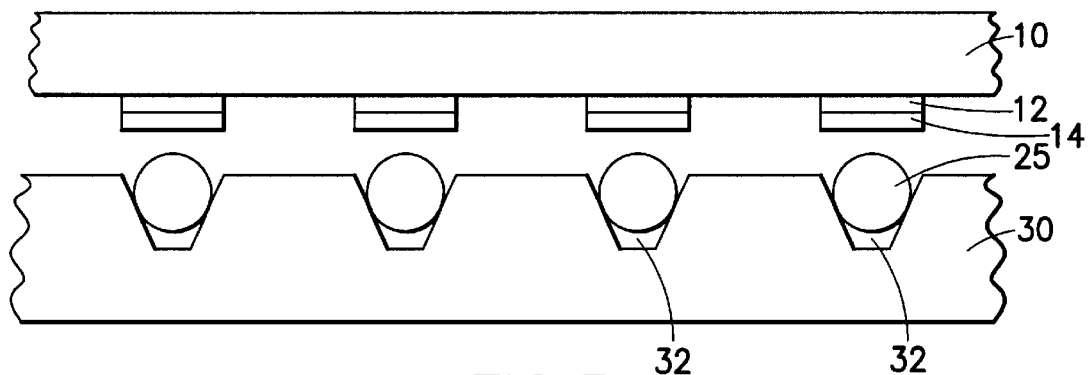
FIG. 5, is an illustration of the joining process of a semiconductor substrate to the preferred interconnection element of this invention using a carrier/boat.

This invention relates to the creation of a high density pluggable connector array for forming a interconnection structure, such as, between a module assembly and a board. The benefit of such an interconnection scheme is that it combines the advantages of high density found in surface mount packages, such as Ball Grid Arrays (BGAs) and Column Grid Arrays (CGAs), with the advantages of pluggability found in conventional Pin Grid Arrays (PGAs), etc.

The process disclosed in this invention allows the use of low melting solders to join the connecting features to the module, while providing highly reliable gold surface for electrical contact. The interconnections created have the final appearance of a gold plated feature connected to the module assembly by means of a solder.

FIGS. 1A, 1B and 1C, illustrate a select few interconnection structures. On a substrate 10, having an input/output (I/O) pad 12, one could have an interconnect feature 16, connected to the pad 12, using solder 14, such as, a low temperature solder 14. The interconnect feature 16, could be a spherical feature 16, such as shown in FIG. 1A, or a cylindrical or rectangular feature 16, such as shown in FIG. 1B, or any other convenient geometry or irregular shape 16, as shown in FIG. 1C.

FIG. 2, illustrates another interconnection structure where the solder bump 14, on the substrate 10, has been either pressed and/or reflowed. On the substrate 10, having an I/O pad 12, the solder 14, could be reflowed during a temperature reflow cycle that would cause the solder 14, to melt and wet the I/O pads 12, and to attach the solder 14, to the substrate 10. The I/O pads 12, are typically plated with a metal that provides a good wetting surface for the solder 14.

In some cases, an intermediate step of solder flattening may be used prior to applying flux. This could be done by placing the solder bump 14, in contact with a planar surface (not shown), and reflowing the solder 14, with sufficient weight or pressure from the planar surface to cause the solder bump 14, to flatten out. The bump 14, as shown in FIG. 2, could be the flattened bump 14.

The solder 14, is preferably a tin based solder. For example, the solder 14, could be selected from a group comprising 96.5 Sn/3.5 Ag, 63 Sn/37 Pb, 95 Sn/5 Pb, to name a few. A wide range of other solder compositions, well known in the art, can also be used.

In most packages with pluggable interconnects, the need for a final gold surface or plating on the interconnect features precludes the ability to directly use low temperature solders, because they wet the gold surface very aggressively, resulting in the gold being completely consumed by the solder and rendering the surface unsuitable for pluggable connection. This phenomenon is termed solder climb or solder bleedout, and it prevents the direct soldering of gold plated components without unacceptable wetting of solder in areas that should remain solder free.

However, this invention provides a method to overcome this problem in order to create such a structure using at least one low temperature solder.

FIGS. 3A and 3B, illustrate a preferred interconnection element or structure 25, of this invention. In order to make the interconnection structure 25, multiple layers of metal are deposited on an interconnection body or core 20. This unplated body or core 20, will be referred to and illustrated as a ball 20, for convenience, even though this does not preclude other variations in geometry, for example, circular, cylindrical, polygonal, rectangular, triangular, nail head, or any other irregular shape, to name a few, or any of the interconnection features 16, as shown in FIGS. 1A, 1B and 1C.

The deposition process for the multiple layers onto the ball 20, is preferably by means of electro-plating, even though other processes like CVD, electroless plating, evaporation, PECVD, sputtering, to name a few, may also be used without adversely affecting the workability of this invention.

The ball 20, is preferably made of Cu, Kovar, Nickel or alloys thereof, however any other alloy or metal that provides good electrical interconnection could be used to make the ball 20.

The interconnection structure 25, as illustrated in FIG. 3A, comprises of a nickel layer 22, a gold layer 24, and a copper layer 26. It is preferred that the thickness of the nickel layer 22, is between about 1 to about 3 micron, the thickness of the gold layer 24, is between about 1 to about 3 micron, and the thickness of the copper layer 26, is between about 1 to about 4 micron.

Another embodiment of the interconnection structure 25, is illustrated in FIG. 3B, which comprises of a nickel layer 22, a gold layer 24, a cobalt layer 27, and a copper layer 29. It is preferred that the thickness of the nickel layer 22, is between about 1 to about 3 micron, the thickness of the gold layer 24, is between about 1 to about 3 micron, the thickness of the cobalt layer 27, is between about 1 to about 2 micron, and the thickness of the copper layer 29, is between about 1 to about 4 micron.

As shown in FIG. 3B, the cobalt layer 27, between the gold layer 24, and the copper layer 29, helps to minimize any interdiffusion between the gold layer 24, and the copper layer 29. However, the copper layer 26, being directly onto the gold layer 24, as shown in FIG. 3A, has given excellent results, and is the preferred embodiment.

The thicknesses for the layers mentioned in FIGS. 3A and 3B, are the preferred thicknesses, however, one could as easily use a different thickness for their specific application.

FIG. 4, is an enlarged view of a carrier or boat 30, containing the preferred interconnection structure 25, of this invention. The plated ball 25, is loaded into blind holes, openings or cavities 32, in the carrier 30. The cavities 32, are located in precise positions with respect to each other so as to form the required array. The boat or carrier 30, could be made from any suitable material, such as, graphite, molybdenum, tantalum, titanium, to name a few.

FIG. 5, is an illustration of the joining process of the semiconductor substrate 10, having an I/O pad 12, and a solder 14, to the preferred interconnection structure 25, of this invention using the carrier 30. It is preferred that the solder bump 14, is first cleaned, and that a layer of flux is deposited on the surface of the solder bump 14. The plated interconnection structure 25, are loaded in a boat or carrier 30, as more clearly seen in FIG. 4, and transferred onto the substrate 10, by placing the substrate 10, in intimate contact with the plated ball 25.

The substrate 10, with the solder bumps 14, and the plated balls 25, in the carrier 30, are brought into intimate contact with each other. It is preferred that the carrier 30, is designed so as to hold this assembly in position during the reflow through a furnace (not shown). The reflow of the solder 14, causes the plated balls 25, to join to the I/O pads 12, on the substrate 10, and creating a connection of reflowed solder 15.

Figure 6:
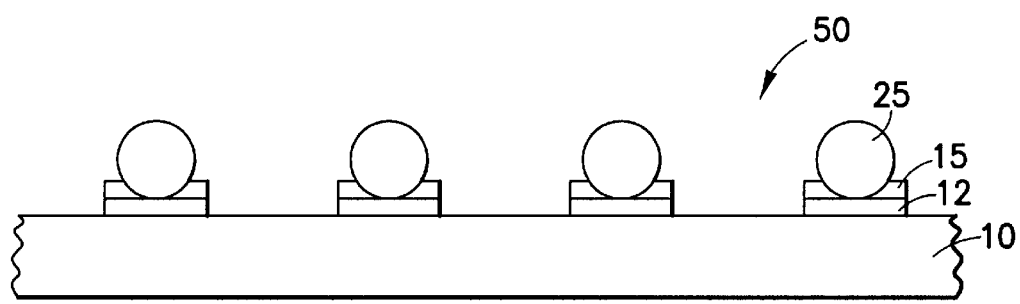
FIG. 6, illustrates the interconnection structures of this invention after they have been joined onto a semiconductor substrate.

FIG. 6, illustrates the interconnection structures 25, of this invention after they have been joined onto a semiconductor substrate 10, forming a substrate assembly 50. The substrate assembly 50, with the plated balls 25, attached at this point consists of plated balls 25, having a final outside layer of copper 26, or copper/cobalt 27/29, (depending on the initial composition of the layers) on top of at least one gold layer 24, as shown in FIGS. 3A and 3B. The final step is now to expose at least one gold layer 24, which would provide the final high density pluggable connector array.

Figure 7A:
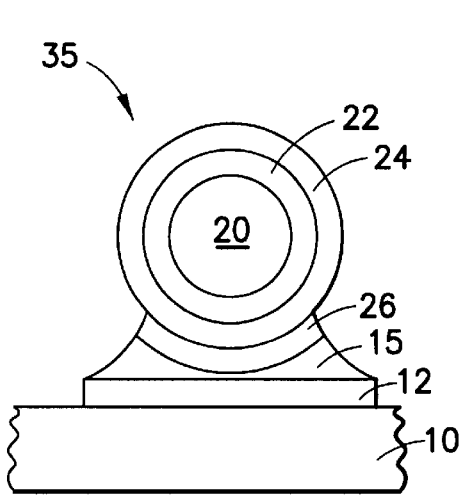
FIGS. 7A and 7B, are an enlarged view of the preferred embodiments of the invention after joining and subsequent etching.
Figure 7B:
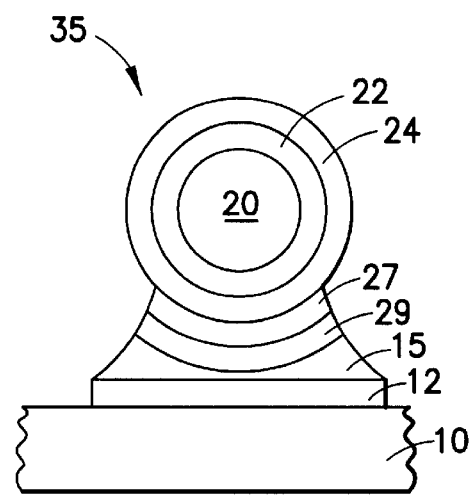

The final structure of the inventive interconnection 35, is shown in FIGS. 7A and 7B, which is an enlarged view of the preferred embodiment of the invention. The assembly 50, is subjected to a process to selectively remove the exterior layers so as to expose at least one of the underlying gold layer 24. The preferred way is to subject the interconnection assembly 35, to an etchant that preferentially attacks the copper layer 26, or the copper/cobalt layer 27/29, and not the reflowed solder layer 15. The process for etching should be self-limiting, i.e., it should stop when it reaches the surface of the gold layer 24. Over etching is not recommended, so as to avoid excessive undercutting of the copper or copper/cobalt material in the joint region.

The etchant used for preferentially etching the copper layer 26 or 29, in the presence of the reflowed low melting solder 15, consists of about 100 ml of sulfuric acid, about 150 ml of about 30 percent hydrogen peroxide, the remainder water, per 1000 ml of etchant volume. The absolute amounts do not matter, rather it is the relative amounts of the above components. The etching with this etchant is preferably carried out at a temperature of about 25° C.

Basically, the etching process involves initial rinsing, degreasing, intermediate rinsing, etching, and final rinsing of the substrate assembly 50.

For a typical assembly 50, one would place it in the degreaser for about 5 minutes, and in the etching bath for about 2 minutes. Of course the etching time will vary with the actual thickness of the copper layer 26 or 29, to be etched and other parameters, such as, temperature and agitation.

For the embodiment that has a coating of the cobalt layer 27, one would use a similar process. The same etchant used for etching the copper layer can also be used to etch the layer of cobalt 27. Of course, there may be other etchants that could also be used, for etching copper and/or cobalt.

It is preferred that the material for the core 20, be selected from a group comprising aluminum, copper, iron, Kovar, nickel or alloys thereof, to name a few.

While the present invention has been particularly described, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A process for forming a multi-layered interconnect structure comprising the steps of:

(a) depositing at least one layer of nickel on a core and completely enveloping said core, (b) depositing at least one layer of gold over said layer of nickel and completely enveloping said layer of nickel, (c) depositing at least one layer of cobalt over said layer of gold and completely enveloping said layer of gold, (d) depositing at least one layer of copper over said layer of cobalt and completely enveloping said layer of cobalt, and then removing portions of said at least one layer of copper and said at least one layer of cobalt, thereby providing said multi-layered interconnect structure.

2. The process of claim 1, wherein material for said core is selected from a group consisting of aluminum, copper, iron, Kovar, nickel and alloys thereof.

3. The process of claim 1, wherein thickness of said nickel layer is between about 1 to about 3 micron, thickness of said gold layer is between about 1 to about 3 micron, thickness of said cobalt layer is between about 1 to about 3 micron, and thickness of said copper layer is between about 1 to about 4 micron.

4. The process of claim 1, wherein said deposition is done by a method selected from a group consisting of CVD, electro-plating, electroless plating, plating, evaporation, PECVD and sputtering.

5. The process of claim 1, wherein thickness of said nickel layer is between about 1 to about 3 micron.

6. The process of claim 1, wherein thickness of said gold layer is between about 1 to about 3 micron.

7. The process of claim 1, wherein thickness of said cobalt layer is between about 1 to about 3 micron.

8. The process of claim 1, wherein thickness of said copper layer is between about 1 to about 4 micron.

* * * * *